PUSH-PULL AMPLIFIER WITH ASYMMETRICAL DRIVE AND LOAD
Filed Sept. 11, 1967
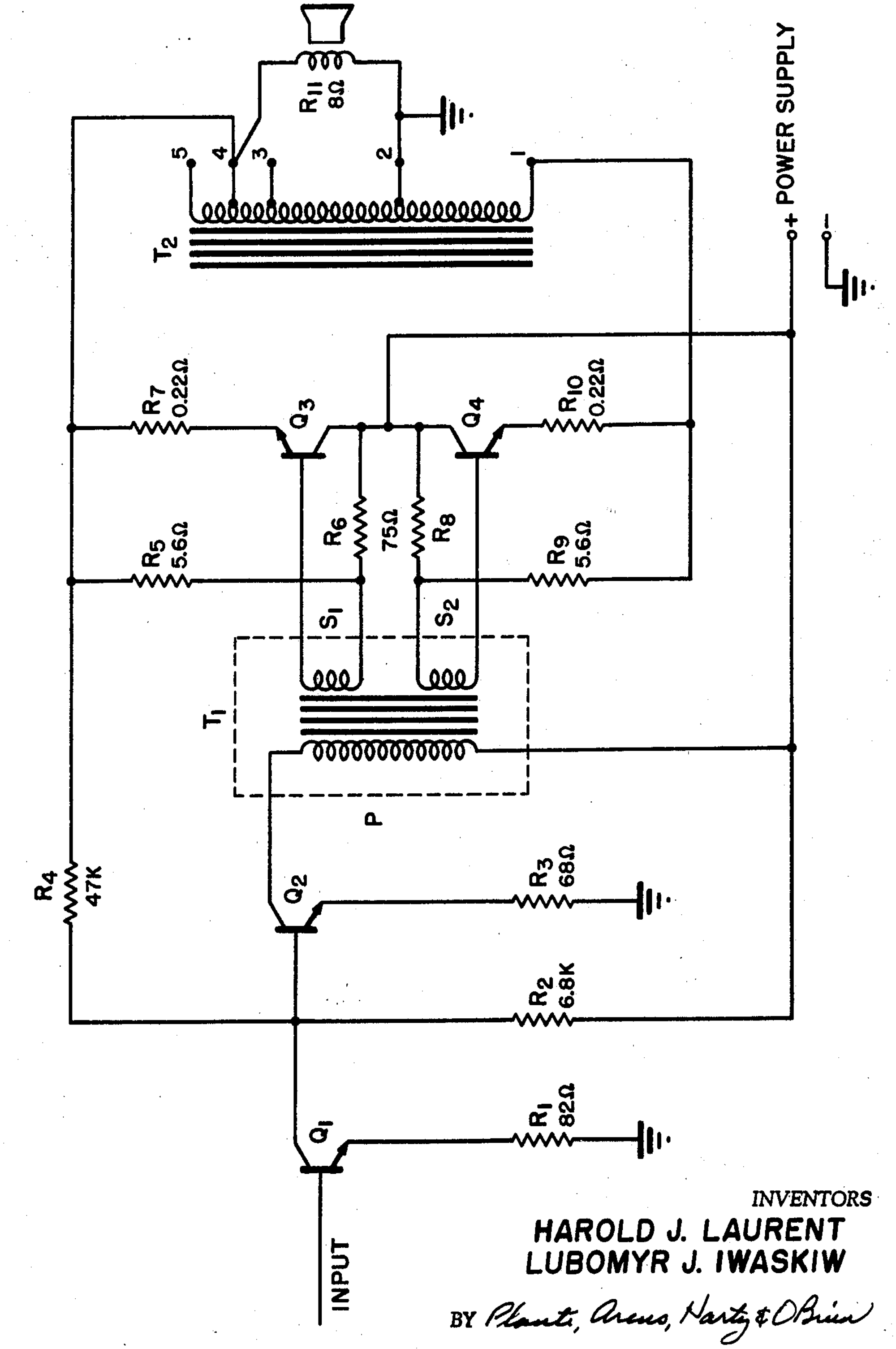
INVENTORS
HAROLD J. LAURENT
LUBOMYR J. IWASKIW
BY Plante, Arens, Hartz & O'Brien
ATTORNEYS 3,478,274

PUSH-PULL AMPLIFIER WITH ASYMMETRICAL DRIVE AND LOAD

Harold J. Laurent and Lubomyr J. Iwaskiw, Baltimore, Md., assignors to The Bendix Corporation, a corporation of Delaware Filed Sept. 11, 1967, Ser. No. 666,643
Int. Cl. H03f 3/04, 3/26
U.S. Cl. 330—14 1 Claim

ABSTRACT OF THE DISCLOSURE

An arrangement to permit the economical use of NPN transistors in an audio power amplifier with the grounded negative power supply and grounded loudspeaker common in automobiles.

BACKGROUND OF INVENTION

Automobile radio receivers are subject to extremes of ambient temperature which must be considered in the design of circuits using transistors as the active elements. In particular, high temperature may induce a destructive thermal runaway in the transistors of the output power amplifier. Silicon transistors are much less sensitive to thermal changes than are germanium transistors but they are primarily available as a production item only in NPN form. This requires that the output transformer be provided with a separate winding for isolation of the loudspeaker leads from the positive side of the battery, or that a large blocking condenser be used in series with the loudspeaker, if the gain of a common emitter stage is to be retained. Although much of this excess of gain over other stage forms will be dedicated to various negative feedbacks, this is not an empty gesture: the feedbacks regulate the amplifier and loudspeaker characteristics, including both signal responses, and bias control favorable to the various combinations of transistor gain, ambient temperature and supply potential encountered in practice. Particular interest attaches to the relative efficiency of an auto-transformer (80 to 95%) over a comparable isolating transformer (60 to 65%) and the phase shift that has to be considered in the feedback network, which will be substantially less than half as great for the auto-transformer than for an isolating transformer using the same amount of material, within the critical frequency range of the latter.

SUMMARY OF THE INVENTION

The individual amplifiers of a push-pull power amplifier stage are asymmetrically driven, to symmetrically excite an asymmetrically coupled load, by individual driver transformer secondaries returned to bias networks shunting the output elements of the associated individual amplifiers.

DESCRIPTION OF THE INVENTION

The sole figure shows a cascade audio amplifier in which $Q_1$ is an NPN transistor small signal amplifier directly coupled to $Q_2$, another NPN transistor of moderate power handling ability serving as a driver for the output stage. A low value resistor $R_3$ provides series feedback to stabilize the current in $Q_2$ at a suitable value and in so doing also fixes the quiescent collector potential of $Q_1$. The resistors $R_2$ and $R_4$ serve the dual function of dividing the power supply potential to a suitable value for the collector of $Q_1$ and base of $Q_2$ while serving as coupling impedance, and of dividing the output signal to a value appropriate to the desired value of overall negative feedback. A small resistor $R_1$ stabilizes the current of $Q_1$ at a value appropriate to the values of the other three resistors to hold each transistor near the center of its linear operating range. A transformer $T_1$ couples the driver transistor $Q_2$ to the push-pull output stage comprising NPN transistors $Q_3$ and $Q_4$. For reasons which will appear, the secondary winding $S_2$ of transformer $T_1$ differs from secondary winding $S_1$ in such fashion that larger signal currents will be produced in $Q_4$ than in $Q_3$. The secondary $S_1$ is connected to the base of transistor $Q_3$ to provide a signal thereto and is returned to the divider network comprising resistor $R_5$ connected to one side of the output transformer $T_2$ and resistor $R_6$ connected to the positive side of the source of power. The resistor $R_6$ in much higher in value than $R_5$ and has a relatively much more positive thermal coefficient of resistivity to reduce the sensitivity of the transistor $Q_3$ to variation in ambient temperature. The resistor $R_7$ also has a high positive thermal coefficient but is substantially heated by the emitter current of transistor $Q_3$ so that the influence of this current of both ambient temperature and transistor tolerances is reduced. In general, the amplifier is symmetrical except as to transformers, that is $Q_4=Q_3$, $R_8=R_6$, $R_9=R_5$ and $R_{10}=R_7$ within commerical tolerances. By means of the networks comprising the resistors, the secondary of the transformer $T_1$ driving each of the transistors $Q_3$ and $Q_4$ may be referred almost to the emitter potentials despite the connection of the grounded load to the emitters, thereby retaining most of the gain of the common emitter mode of operation.

It is in the connection of a load having one side grounded in common with the power supply that difficulties arise. High efficiency is desirable to reduce self-heating of the output transistors to a moderate value; hence, they are biased to operate in Class AB mode, perhaps verging on Class B mode. Further, efficiency dictates that the output transformer shall be connected as an auto-transformer having a single tapped winding, since the power available to the load can be about 40% greater than with a comparable transformer having an electrically separate secondary. The improvement in efficiency at high output levels is most evident during that portion of the cycle where $Q_3$ is conducting and $Q_4$ is cut off. The load is rather directly driven then, the output transformer contributing mostly only the relatively small magnetic losses. When $Q_4$ is conducting and $Q_3$ is cut off, the load is coupled to the transistor by transformer action and the resistance of the winding increases the losses. However, even on this half-cycle, the copper losses are less than half that of a two-winding transformer using the same materials, since putting all the copper in one winding will double the cross-section area of the wire and there is an incidental improvement in space factor. For these reasons, an auto-transformer designated $T_2$ as shown in the figure is used, where the grounded side of the load $R_{11}$ and power supply are connected to the intermediate tap 2, the emitter current of the transistor $Q_3$ is led to tap 4 and that of transistor $Q_4$ to tap 1. The load $R_{11}$ is also shown connected to tap 4, but it might as readily be connected to tap 3 or terminal 5, to provide a moderate transformation ratio for the purpose of matching the load $R_{11}$ to the amplifier. The showing of the alternative connections 3 and 5 is illustrative; only one would be elected and present, if any, in a practical design, and it should also be evident that the efficiency tends to that of a two-winding transformer as the impedance transformation ratio becomes large.

At high signal levels transistor $Q_3$ and $Q_4$ drive the load alternately, but unequally because the transformer losses are substantially greater when transistor $Q_4$ is driving. The difference in efficiency appears as even-harmonic distortion. This can be reduced by driving transistor $Q_4$ harder than transistor $Q_3$ but then transistor $Q_4$ saturates at a lower input signal level than transistor $Q_3$ and even-harmonic distortion grows rapidly with signal level.

To preserve odd-order symmetry and attain the maximum output at low distortion by causing both transistors to saturate at the same input signal level the load presented to the transistors must be asymmetrically altered by moving the tap 2 toward the terminal 1 from the median between terminal 1 and tap 4 of the auto-transformer $T_2$ and simultaneously proportioning the windings $S_1$ and $S_2$ (or the connections to the respective transistors) to provide greater excitation of transistor $Q_4$ than of transistor $Q_3$.

The proper position of the tap 2 can be found by trial of two or three experimental taps, with a further trial of a tap position derived from interpolation of the results. In this approach a signal generator is connected to terminal 1 and tap 2, and the load $R_{11}$ is connected to tap 2 and the other terminal appropriate to its value, preferably tap 4. When tap 2 is properly placed, a given signal potential produced between terminal 1 and tap 2 by the generator will be matched by an identical potential between taps 2 and 4 if the load is across them. If the load is otherwise connected, the generator can be connected to taps 2 and 4 and set to produce the same signal potential. The signal measured across the load should be the same for both generator positions when the tap 2 is properly located. Fixing the tap by analytical methods is about as easy if working with familiar materials, but the experimental approach better illustrates what is accomplished.

The above proportions will bring both transistors to saturation at the same signal level if the drive to transistor $Q_4$ is greater than the drive to transistor $Q_3$ in the proportion to maintain odd-order symmetry. To define the existing relations, we use the following:

E=a signal potential applied to $T_2$
I=a resulting current through $T_2$
$d$=the efficiency of transfer of EI to the load $R_{11}$
N=number of turns in a section of $T_2$
L=inductance of a section of $T_2$ and append the subscript 12 to indicate application to the winding section between terminal 1 and tap 2, and the subscript 24 to indicate the winding section between taps 2 and 4. Then, for equal load excitation $$d_{12}EI_{12}=d_{24}EI_{24}$$

or $$I_{12}/I_{24}=d_{24}/d_{12}$$

and $$d_{12}I_{12}^2(N_{12}/N_{24})^2R_{11}=d_{24}I_{24}^2R_{11}$$

with $R_{11}$ connected as in the figure. Since the inductance of a winding is proportional to the square of the number of turns, $$d_{12}I_{12}^2(L_{12}L_{24})R_{11}=d_{24}I_{24}^2R_{11}$$

Removing identities from the last expression, $$L_{12}/L_{24}=I_{24}/I_{12}$$

Thus, we can express the ratio of signal currents derived from the transistor $Q_3$ and $Q_4$ as inverse to the ratio of efficiency or ratio of inductance of the associated transformer windings. Either ratio would be known for a transformer analytically designed, and the inductance ratio would be evident for an experimentally designed transformer. It remains only to adjust the proportions of the secondaries $S_1$ and $S_2$ of the driver transformer $T_1$ to produce the required ratio of signal currents in the transistors $Q_3$ and $Q_4$.

The significant ratios of transformers $T_1$ and $T_2$ can be tightly controlled in production, but the normal tolerances on the transistor $Q_3$ and $Q_4$ and the associated resistors will introduce random departures from the asymmetries intended to produce overall symmetry, in common with all Class AB amplifiers. These departures appear as an excess of even harmonic distortion which may become quite substantial in a portion of a production run of the amplifiers. The feedback by way of $R_4$ is consequently more significant than it would be in a Class A amplifier.

The invention claimed is:

1. In a push-pull amplifying circuit including a pair of transistors of the same type, an auto-transformer for coupling said transistors to a useful load, said auto-transformer reflecting different efficiencies to each of said transistors, and a driver transformer to supply different amounts of signal drive to each of said transistors to compensate for the difference in efficiency with which said auto-transformer couples each of said transistors to said useful load, the improvement comprising a pair of separate secondaries on said driver transformer, and a resistive network connecting each of said secondaries to each of said transistors to provide operating bias and signal feedback to each of said transistors, each of said resistive networks including first, second and third resistors of relatively decreasing value and being connected serially in order from the collector electrode to the emitter electrode of one of said transistors, said secondary winding being connected between the base electrode of said transistor and the junction of said first and second resistors, and said auto-transformer being connected from the junction of said second and third resistors of one of said networks to the junction of said second and third resistors of the other of said networks.

References Cited

FOREIGN PATENTS 660,131 3/1963 Canada.

JOHN KOMINSKI, Primary Examiner

U.S. Cl. X.R.

330—15, 195